(12) United States Patent
Sato

(10) Patent No.: US 8,299,842 B2
(45) Date of Patent: Oct. 30, 2012

(54) BIDIRECTIONAL SWITCH

(75) Inventor: Shinji Sato, Niiza (JP)

(73) Assignee: Sanken Electric Co., Ltd., Niiza-shi (JP)

( * ) Notice: Subject to any disclaimer, the term of this patent is extended or adjusted under 35 U.S.C. 154(b) by 55 days.

(21) Appl. No.: 12/962,028

(22) Filed: Dec. 7, 2010

(65) Prior Publication Data

US 2011/0156795 A1 Jun. 30, 2011

(30) Foreign Application Priority Data

Dec. 28, 2009 (JP) ................................ 2009-297871

(51) Int. Cl.
*H03K 17/687* (2006.01)
(52) U.S. Cl. ........................ 327/427; 327/434
(58) Field of Classification Search ........................ None
See application file for complete search history.

(56) References Cited

U.S. PATENT DOCUMENTS 7,026,858 B2 * 4/2006 Tosaka ........................... 327/427
7,852,137 B2 * 12/2010 Machida et al. ................ 327/427

FOREIGN PATENT DOCUMENTS

| JP | 10-248264 | 9/1998 |
|---|---|---|
| JP | 10-261945 | 9/1998 |
| JP | 2002-84174 | 3/2002 |
| JP | 2004-79892 | 3/2004 |
| JP | 4123274 | 5/2008 |
| JP | 2009-159222 | 7/2009 |

OTHER PUBLICATIONS

Japanese Office Action issued Sep. 13, 2011, in Patent Application No. 2009-297871 (with Partial English translation).

* cited by examiner

*Primary Examiner* — Cassandra Cox
(74) *Attorney, Agent, or Firm* — Oblon, Spivak, McClelland, Maier & Neustadt, L.L.P.

(57) ABSTRACT

A bidirectional switch includes a semiconductor switch Q3 having a gate and main electrodes serving as a drain and source. The semiconductor switch has a HEMT structure so that one of the main electrodes having a lower voltage than the other serves as a virtual source and the other main electrode as a virtual drain. The semiconductor switch receives a gate signal between the gate and the virtual source, to turn on/off a current in both directions. A gate signal generator 13 is connected between the gate and virtual source of the semiconductor switch, to apply the gate signal to the gate of the semiconductor switch. An overvoltage protection circuit is connected between the virtual drain and gate of the semiconductor switch. The overvoltage protection circuit has a resistor 16 and a constant voltage diode 15.

1 Claim, 1 Drawing Sheet

BIDIRECTIONAL SWITCH

BACKGROUND OF THE INVENTION

1. Field of the Invention

The present invention relates to a bidirectional switch capable of bidirectionally turning on/off a current, and particularly, to a technique of suppressing a bidirectional overvoltage with an additional simple circuit.

2. Description of the Related Art

A power conversion apparatus employing a power semiconductor switch to convert AC or DC power of a certain level into AC or DC power of another level is used for uninterrupted power sources, motor inverters, communication DC power sources, and the like.

Generally, the power semiconductor switch is vulnerable to an overvoltage and will break if receiving, even momentarily, an overvoltage exceeding a withstand voltage of the power semiconductor switch. To prevent the overvoltage, there is a technique of connecting a series circuit of a constant voltage diode and a resistor between the drain and gate of the power semiconductor switch.

FIG. 1 is a circuit diagram illustrating a semiconductor switch disclosed in Japanese Unexamined Patent Application Publication No. 2004-079892. This semiconductor switch is a power semiconductor switch provided with an overvoltage protection circuit. In FIG. 1, the semiconductor switch FET Q1 has a drain and source that are connected through terminals 11 and 12 to a main circuit (not illustrated). The drain of the FET Q1 is connected to an anode of a diode 17. A cathode of the diode 17 is connected through a resistor 16 to a cathode of a constant voltage diode (Zener diode) 15. A breakdown voltage of the constant voltage diode 15 is lower than a withstand voltage of the FET Q1.

An anode of the constant voltage diode 15 is connected to a gate of the FET Q1 and a first end of a resistor 14. A gate signal unit 13 is connected to a second end of the resistor 14 and the source of the FET Q1. A series circuit including the diode 17, resistor 16, and constant voltage diode 15 is connected between the drain and gate of the FET Q1, to form the overvoltage protection circuit.

The gate signal unit 13 turns on the FET Q1 in response to an ON signal from a control circuit (not illustrated), so that an anode voltage is supplied to the terminal 12. In response to an OFF signal from the control circuit, the gate signal unit 13 turns off the FET Q1, so that a cathode voltage is supplied to the terminal 12.

Operation of the related art illustrated in FIG. 1 when an overvoltage occurs between the drain and source of the FET Q1 will be explained.

When the gate signal unit 13 applies a cathode voltage through the resistor 14 to the gate of the FET Q1, the FET Q1 turns off and a drain voltage of the FET Q1 increases. If a drain-gate voltage of the FET Q1 exceeds the breakdown voltage of the constant voltage diode 15, a current is supplied from the drain of the FET Q1 to the gate signal unit 13 through the diode 17, resistor 16, and constant voltage diode 15, to increase a gate voltage of the FET Q1.

If the increased gate voltage of the FET Q1 causes a gate-source voltage thereof to exceed a gate threshold voltage of the FET Q1, the FET Q1 turns on to pass a drain-source current and decrease the drain voltage, thereby preventing a drain-source overvoltage of the FET Q1.

Japanese Patent No. 4123274 discloses an AC switch (bidirectional switch) to turn on/off an AC signal. This AC switch is a compound semiconductor such as silicon carbide (SiC) or gallium nitride (GaN). As illustrated in FIG. 2, this related art connects an FET Q2 serving as a normally-ON switch between terminals 11 and 12. The FET Q2 has main electrodes 21 and 22 and a gate G. The normally-ON FET Q2 has symmetrical drain and source, and therefore, one of the main electrodes 21 and 22 connected to one of the terminals 11 and 12 that has a higher voltage than the other terminal becomes a drain and the other main electrode becomes a source.

A first end of a gate signal unit 13 is connected to the gate of the FET Q2. The main electrode 21 of the FET Q2 is connected to a cathode of a diode D1 and the main electrode 22 of the FET Q2 is connected to a cathode of a diode D2. Anodes of the diodes D1 and D2 are connected to a second end of the gate signal unit 13.

When an AC signal is inputted between the terminals 11 and 12 and when a voltage at the terminal 11 is higher than that at the terminal 12, the main electrode 21 of the FET Q2 becomes a drain and the main electrode 22 a source. If a gate signal is supplied to make a gate voltage of the FET Q2 equal to or higher than the voltage at the main electrode 22, i.e., the source of the FET Q2, the FET Q2 turns on to turn on the diode D2. At this time, the diode D1 is reversely biased and turns off.

If the voltage at the terminal 12 is higher than that at the terminal 11, the main electrode 21 of the FET Q2 becomes a source and the main electrode 22 a drain. If a gate signal is supplied to make the gate voltage of the FET Q2 equal to or higher than the voltage at the main electrode 21, i.e., the source of the FET Q2, the FET Q2 turns on to turn on the diode D1. At this time, the diode D2 is reversely biased and turns off.

Even if the voltage at the terminal 11 is higher than that at the terminal 12, or even if the voltage at the terminal 12 is higher than that at the terminal 11, the FET Q2 turns off if a gate signal is supplied to make the gate voltage of the FET Q2 lower than the voltage at the main electrode serving as a source.

Another related art concerning a semiconductor switch is disclosed in Japanese Unexamined Patent Application Publication No. H10-261945.

SUMMARY OF THE INVENTION

The AC switch illustrated in FIG. 2 or the bidirectional switch using a high electron mobility transistor (HEMT) made of wide-band-gap semiconductor such as GaN and SiC has a low withstand voltage against an overvoltage. The bidirectional switch is exposed to an overvoltage in both directions, and therefore, must be provided with two overvoltage protection circuits each being, for example, the one illustrated in FIG. 1, to complicate the overvoltage protection system.

The present invention provides a bidirectional switch having a simple circuit configuration to suppress an overvoltage in both directions.

According to an aspect of the present invention, the bidirectional switch includes a semiconductor switch having a gate and main electrodes serving as a drain and source, the semiconductor switch having a HEMT structure so that one of the main electrodes having a lower voltage than the other serves as a virtual source and the other main electrode as a virtual drain, the semiconductor switch turning on/off in a manner of both directions upon receiving a gate signal between the gate and the virtual source, and an overvoltage protection circuit connected between the virtual drain and gate of the semiconductor switch and having a resistor and a constant voltage diode.

DESCRIPTION OF THE PREFERRED EMBODIMENT

A bidirectional switch according to an embodiment of the present invention will be explained in detail with reference to the drawings.

Figure 1:
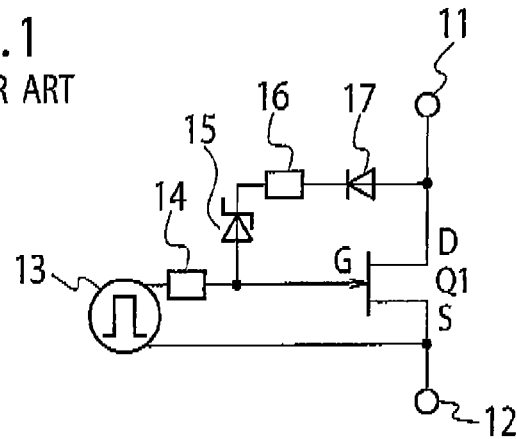
FIG. 1 is a circuit diagram illustrating a semiconductor switch according to a related art.
Figure 2:
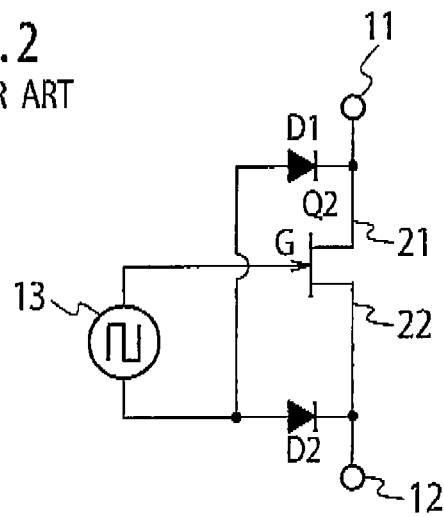
FIG. 2 is a circuit diagram illustrating an AC switch according to a related art.
Figure 3:
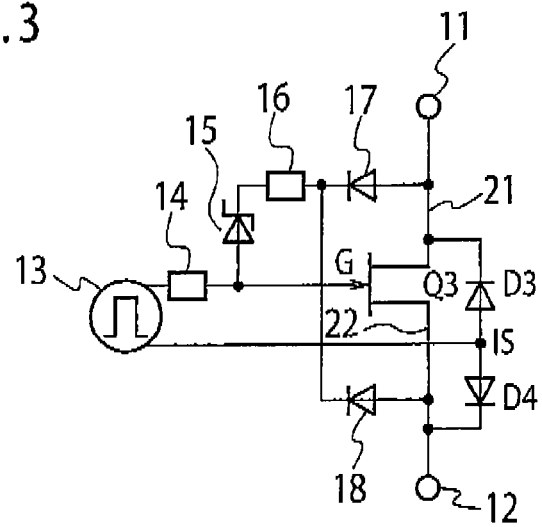
FIG. 3 is a circuit diagram illustrating a bidirectional switch according to an embodiment of the present invention.

FIG. 3 is a circuit diagram illustrating the bidirectional switch according to an embodiment of the present invention. This bidirectional switch employs a bidirectional HEMT Q3 made of wide-band-gap semiconductor such as GaN and SiC.

The bidirectional HEMT Q3 has a gate G and main electrodes serving as a drain and source. The bidirectional HEMT Q3 has a HEMT structure in which one of the main electrodes having a lower voltage than the other serves as a virtual source and the other main electrode as a virtual drain. In response to a gate signal applied between the gate and the virtual source, the bidirectional HEMT Q3 turns on to complete or turns off to interrupt a circuit in a manner of both directions.

The virtual drain or source of the bidirectional HEMT Q3 connected to a terminal 11 and an anode of a diode 17 is connected to a cathode of a diode D3 (first diode). An anode of the diode D3 is connected to an anode of a diode D4 (second diode) and a first end of a gate signal generator 13.

A cathode of the diode D4 is connected to a terminal 12 and an anode of a diode 18. A cathode of the diode 18 is connected to a cathode of the diode 17 and a first end of a resistor 16. A second end of the resistor 16 is connected to a cathode of a constant voltage diode (Zener diode) 15. An anode of the constant voltage diode 15 is connected to a first end of a resistor 14 and the gate G of the bidirectional HEMT Q3. The diode 17 (18), resistor 16, and constant voltage diode 15 form a series circuit serving as an overvoltage protection circuit.

The gate signal generator 13 applies a gate signal through the resistor 14 to the gate G of the bidirectional HEMT Q3.

Operation of the bidirectional switch according to the embodiment will be explained. First, operation when an AC signal is applied to the bidirectional HEMT Q3 will be explained. The AC signal is applied between the terminals 11 and 12. If a voltage at the terminal 11 is higher than that at the terminal 12, the main electrode 21 of the bidirectional HEMT Q3 becomes a drain and the main electrode 22 a source. When a gate signal is applied to make a voltage at the gate G of the HEMT Q3 equal to or higher than the voltage at the main electrode 22 serving as a source, the HEMT Q3 turns on.

If the voltage at the terminal 12 is higher than that at the terminal 11, the main electrode 21 of the bidirectional HEMT Q3 becomes a source and the main electrode 22 a drain. When a gate signal is applied to make the voltage at the gate G of the HEMT Q3 equal to or higher than the voltage at the main electrode 21 serving as a source, the HEMT Q3 turns on.

Even if the voltage at the terminal 11 is higher than that at the terminal 12, or even if the voltage at the terminal 12 is higher than that at the terminal 11, the bidirectional HEMT Q3 turns off if a gate signal is applied to make the voltage at the gate of the HEMT Q3 lower than the voltage at the main electrode serving as a source.

Operation of the bidirectional switch according to the embodiment when an overvoltage is applied in both directions, i.e., to the main electrodes 21 and 22 will be explained.

When an anodic overvoltage occurs on the main electrode 21, the main electrode 21 becomes a virtual drain and the main electrode 22 a virtual source. When the overvoltage on the main electrode 21 causes a drain-gate voltage of the bidirectional HEMT Q3 to exceed the breakdown voltage of the constant voltage diode 15, a current is supplied from the drain of the HEMT Q3 to the terminal 12 through the diode 17, resistor 16, constant voltage diode 15, gate signal generator 13, and diode D4, thereby increasing a gate voltage of the HEMT Q3.

When the increased gate voltage of the bidirectional HEMT Q3 makes a gate-source voltage of the HEMT Q3 exceed a gate threshold voltage of the HEMT Q3, the HEMT Q3 turns on to pass a drain-source current and decrease the drain voltage of the HEMT Q3, thereby preventing a drain-source overvoltage of the HEMT Q3.

When an anodic overvoltage occurs on the main electrode 22, the main electrode 22 becomes a virtual drain and the main electrode 21 a virtual source. When the overvoltage on the main electrode 22 causes a drain-gate voltage of the bidirectional HEMT Q3 to exceed the breakdown voltage of the constant voltage diode 15, a current passes from the drain of the HEMT Q3 to the terminal 11 through the diode 18, resistor 16, constant voltage diode 15, gate signal generator 13, and diode D3, thereby increasing a gate voltage of the HEMT Q3.

When the increased gate voltage of the bidirectional HEMT Q3 makes a gate-source voltage of the HEMT Q3 exceed the gate threshold voltage of the HEMT Q3, the HEMT Q3 turns onto pass a drain-source current and decrease the drain voltage of the HEMT Q3, thereby preventing a drain-source overvoltage of the HEMT Q3.

In this way, the bidirectional switch according to the embodiment connects the diode 17 (18), resistor 16, and constant voltage diode 15 between the virtual drain and gate of the bidirectional HEMT Q3. As a result, with a simple circuit of the single constant voltage diode 15, the embodiment is capable of suppressing an overvoltage on the HEMT Q3 in both directions. The bidirectional HEMT Q3 is a single semiconductor element, and therefore, is inexpensive.

The present invention is applicable to uninterrupted power source apparatuses, motor inverters, communication DC power sources, and the like.

This application claims benefit of priority under 35USC §119 to Japanese Patent Application No. 2009-297871, filed on Dec. 28, 2009, the entire contents of which are incorporated by reference herein. Although the invention has been described above by reference to certain embodiments of the invention, the invention is not limited to the embodiments described above. Modifications and variations of the embodiments described above will occur to those skilled in the art, in light of the teachings. The scope of the invention is defined with reference to the following claims.

What is claimed is:

1. A bidirectional switch comprising:
   a semiconductor switch having a gate and main electrodes serving as a drain and a source, the semiconductor switch having a HEMT structure so that one of the main electrodes having a lower voltage than the other serves as a virtual source and the other main electrode as a virtual drain, and the semiconductor switch turning on/off in a manner of both directions upon receiving a gate signal between the gate and the virtual source;

an overvoltage protection circuit connected between the virtual drain and gate of the semiconductor switch and having a resistor and a constant voltage diode;

a first diode having a cathode connected to the virtual drain of the semiconductor switch and an anode connected to an end of a gate signal generator; and a second diode having an anode connected to the end of the gate signal generator and the anode of the first diode and a cathode connected to the virtual source of the semiconductor switch, wherein the overvoltage protection circuit includes a series circuit having a third diode, the resistor, and the constant voltage diode.

* * * * *